US009093351B2

(12) United States Patent
Sakai et al.

(10) Patent No.: US 9,093,351 B2
(45) Date of Patent: Jul. 28, 2015

(54) SOLID-STATE IMAGING APPARATUS

(71) Applicant: CANON KABUSHIKI KAISHA, Tokyo (JP)

(72) Inventors: Seiichirou Sakai, Yokohama (JP); Takashi Matsuda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 113 days.

(21) Appl. No.: 13/788,951

(22) Filed: Mar. 7, 2013

(65) Prior Publication Data

US 2013/0248939 A1   Sep. 26, 2013

(30) Foreign Application Priority Data

Mar. 21, 2012   (JP) ................................. 2012-063764
Mar. 21, 2012   (JP) ................................. 2012-064144

(51) Int. Cl.
| | | |
|---|---|---|
| *H01L 27/148* | (2006.01) | |
| *H04N 5/361* | (2011.01) | |
| *H04N 3/14* | (2006.01) | |
| *H01L 27/146* | (2006.01) | |

(52) U.S. Cl.
CPC .......... *H01L 27/14806* (2013.01); *H04N 5/361* (2013.01); *H01L 27/14601* (2013.01); *H01L 27/14831* (2013.01); *H04N 3/1575* (2013.01)

(58) Field of Classification Search
CPC .................... H01L 27/14806; H01L 27/14831; H01L 27/14601; H04N 5/361; H04N 3/1575
USPC ............ 257/231, 290–292, 444; 438/197, 48, 438/59; 250/214.1; 348/308, 295, 302
See application file for complete search history.

(56) References Cited

U.S. PATENT DOCUMENTS

| | | | |
|---|---|---|---|
| 4,663,669 A | 5/1987 | Kinoshita et al. ........ 358/213.19 |
| 4,774,585 A | 9/1988 | Suga et al. ............... 358/213.19 |
| 7,214,575 B2 * | 5/2007 | Rhodes .......................... 438/197 |
| 7,227,208 B2 | 6/2007 | Ogura et al. .................... 257/292 |
| 7,294,818 B2 | 11/2007 | Matsuda et al. ............. 250/208.1 |
| 7,456,880 B2 | 11/2008 | Okita et al. .................... 348/243 |
| 7,514,732 B2 | 4/2009 | Okita et al. .................... 257/292 |
| 7,605,415 B2 | 10/2009 | Koizumi et al. ............... 257/291 |
| 7,629,568 B2 | 12/2009 | Koizumi et al. .......... 250/214 R |
| 7,638,826 B2 | 12/2009 | Hiyama et al. ................ 257/291 |
| 7,812,873 B2 | 10/2010 | Hiyama et al. ................ 348/294 |

(Continued)

FOREIGN PATENT DOCUMENTS

JP   2009-033316 A   2/2009

*Primary Examiner* — Mohammed Shamsuzzaman
(74) *Attorney, Agent, or Firm* — Fitzpatrick, Cella, Harper & Scinto (57) ABSTRACT

A solid-state imaging apparatus includes a plurality of pixels, each pixel including: a photoelectric conversion unit; an amplification element; a first signal holding unit and a second signal holding unit arranged on an electric pathway between the photoelectric conversion unit and an input node of the amplification element; a first electric charge transfer unit configured to transfer an electron of the photoelectric conversion unit to the first signal holding unit; and a second electric charge transfer unit configured to transfer an electron held by the first signal holding unit to the second signal holding unit, wherein a voltage supplied to a first control electrode when the electron of the photoelectric conversion unit is transferred to the first signal holding unit is lower than a voltage supplied to a second control electrode when the electron held by the first signal holding unit is transferred to the second signal holding unit.

8 Claims, 9 Drawing Sheets

(56) References Cited

U.S. PATENT DOCUMENTS

| | | | |
|---|---|---|---|
| 8,106,343 B2 | 1/2012 | Arishima et al. | 250/208.1 |
| 8,199,235 B2 | 6/2012 | Okita et al. | 348/301 |
| 8,345,133 B2 | 1/2013 | Matsuda et al. | 348/294 |
| 2004/0065808 A1* | 4/2004 | Kochi et al. | 250/214.1 |
| 2004/0251394 A1* | 12/2004 | Rhodes et al. | 250/208.1 |
| 2006/0125007 A1* | 6/2006 | Rhodes | 257/346 |
| 2008/0036891 A1* | 2/2008 | Ono et al. | 348/308 |
| 2010/0264298 A1 | 10/2010 | Ryoki et al. | 250/208.1 |
| 2011/0080492 A1 | 4/2011 | Matsuda et al. | 348/222.1 |
| 2011/0080493 A1 | 4/2011 | Kono et al. | 348/222.1 |
| 2011/0134270 A1 | 6/2011 | Arishima et al. | 348/222.1 |
| 2011/0285893 A1 | 11/2011 | Sakai | 348/324 |
| 2011/0316839 A1* | 12/2011 | Minowa et al. | 345/211 |
| 2012/0008029 A1 | 1/2012 | Matsuda et al. | 348/300 |
| 2012/0025280 A1* | 2/2012 | Narui | 257/292 |
| 2012/0262613 A1 | 10/2012 | Kono et al. | 348/300 |
| 2015/0035030 A1* | 2/2015 | Okita | 257/292 |

* cited by examiner

SOLID-STATE IMAGING APPARATUS

BACKGROUND OF THE INVENTION

1. Field of the Invention

The present invention relates to a solid-state imaging apparatus including a plurality of photoelectric conversion elements configured to convert incident light to electric signals.

2. Description of the Related Art

Conventionally, a pixel circuit described in FIG. 4 of Japanese Patent Application Laid-Open No. 2009-33316 is known as a pixel circuit of a MOS solid-state imaging apparatus. Japanese Patent Application Laid-Open No. 2009-33316 discloses a configuration including a unit, in which pixels are arranged two-dimensionally, and floating diffusions (hereinafter, also called "FD") of adjacent pixels in the vertical direction are connected electrically through connection switches.

In the configuration as shown in FIG. 4 of Japanese Patent Application Laid-Open No. 2009-33316, a condition for turning on an FD connecting transistor configured to connect the FDs of adjacent pixels is (gate high voltage of FD connecting transistor)−(reset voltage of FD)>(threshold of FD connecting transistor). If the threshold of the FD connecting transistor is high, the FD connecting transistor does not turn on, and voltages of the FDs cannot be averaged. Therefore, reset voltages of the FDs vary in the connected FDs, and a correct reference voltage (dark level) cannot be read. This affects subtraction between a light signal voltage and a reference voltage.

An object of an embodiment of the present invention is to surely turn on an FD connecting transistor in a solid-state imaging apparatus including the FD connecting transistor when turning on the FD connecting transistor.

SUMMARY OF THE INVENTION

According to an aspect of the present invention, a solid-state imaging apparatus comprises a plurality of pixels arranged two-dimensionally, wherein each of the pixels comprises: a photoelectric conversion element configured to generate an electric charge by photoelectric conversion; a floating diffusion; a transfer transistor configured to transfer the electric charge generated by the photoelectric conversion element to the floating diffusion; an amplifying portion configured to output a signal based on an electric charge in the floating diffusion; and a reset transistor configured to reset a voltage of the floating diffusion, wherein the solid-state imaging apparatus further comprises a connecting transistor configured to connect electrically between the floating diffusions of the plurality of pixels, and a threshold voltage of the connecting transistor is lower than a threshold voltage of the reset transistor.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

An embodiment of the present invention will now be described with reference to the drawings. In the specification, "connection" denotes electrical connection.

First Embodiment

A first embodiment will be described.

Figure 1:
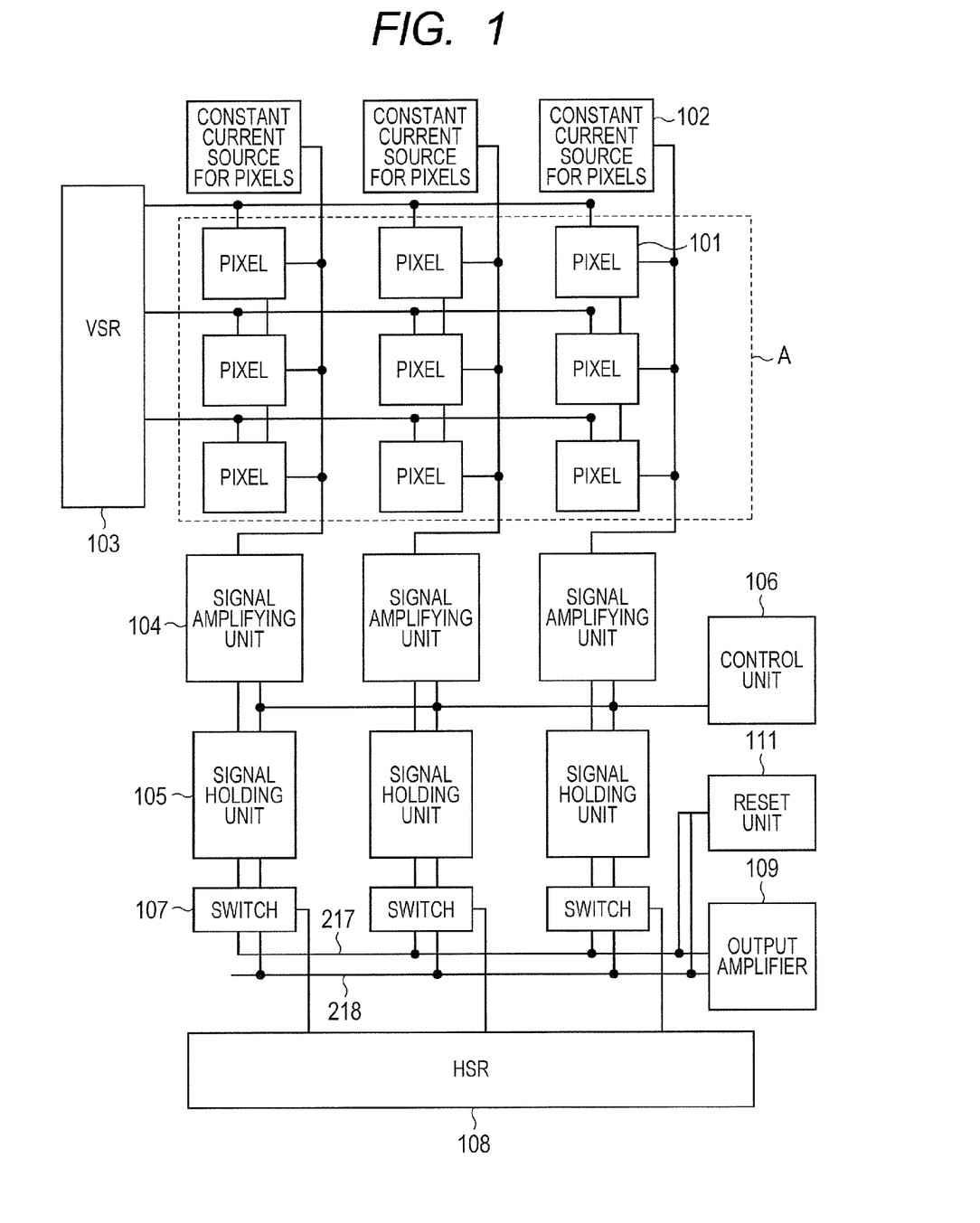
FIG. 1 is a diagram illustrating a configuration example of a solid-state imaging apparatus according to a first embodiment.

FIG. 1 is a block diagram illustrating a configuration example of a solid-state imaging apparatus according to the first embodiment. The solid-state imaging apparatus includes a pixel array A, constant current sources 102 for pixels, a vertical scanning circuit 103, signal amplifying units 104, signal holding units 105, a control unit 106 of signal amplifying units and signal holding units, and switches 107. The solid-state imaging apparatus also includes a horizontal scanning circuit 108, an output amplifier 109, horizontal output lines 217 and 218, and a resetting unit 111 of the horizontal output lines 217 and 218.

The pixel array A includes a plurality of pixels 101, and the pixels 101 are disposed two-dimensionally to form a plurality of rows and columns. Although FIG. 1 illustrates an example that the pixel array A includes the pixels 101 arranged in three rows and three columns, this is intended to simplify the description, not to limit the configuration of the pixel array A. The pixels 101 include photoelectric conversion elements configured to generate electric charges by photoelectric conversion, and signals obtained by the photoelectric conversion elements are supplied to the signal amplifying units 104 through column signal lines.

The signal amplifying units 104 are configured to read signals from the pixel array A. The signal holding units 105 hold the signals read by the signal amplifying units 104. The output amplifier 109 is configured to read the signals held by the signal holding units 105 through the switches 107. The signal amplifying unit 104 and the signal holding unit 105 may be arranged for each column or may be arranged for a plurality of columns.

The vertical scanning circuit 103 typically includes a shift register which selects a row in the pixel array A. The horizontal scanning circuit 108 typically includes a shift register which selects a column in the pixel array A. In the example, the column in the pixel array A is selected by selectively activating the switch 107 so that a signal is transferred from the signal holding unit 105 to the output amplifier 109. The resetting unit 111 resets the horizontal output lines 217 and 218 to a predetermined voltage.

Figure 2:
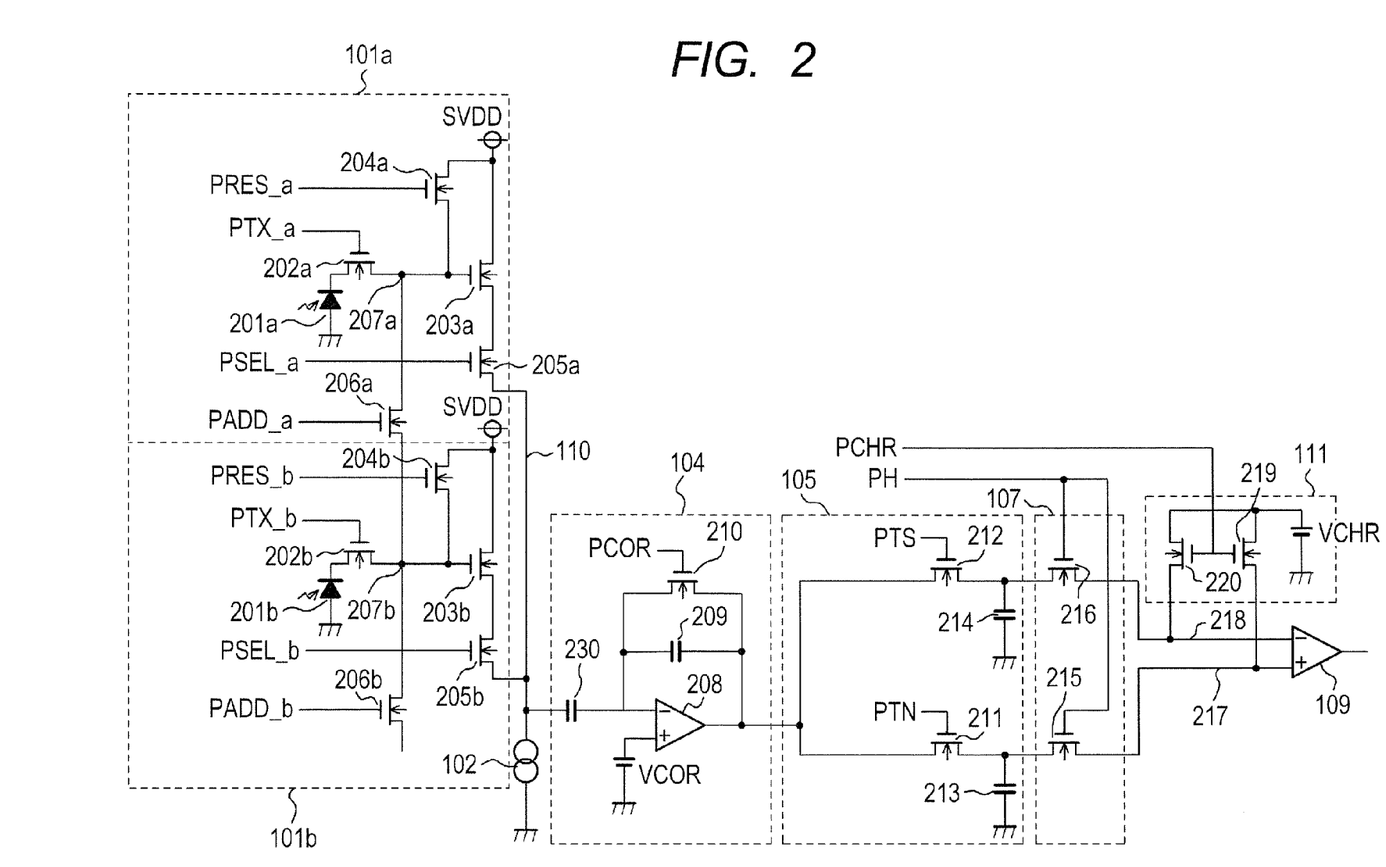
FIG. 2 is a diagram illustrating a detailed configuration example of the solid-state imaging apparatus illustrated in FIG. 1.

FIG. 2 is a diagram illustrating a detailed configuration example of the pixels 101 (101a and 101b), the signal amplifying unit 104, the signal holding unit 105 and the resetting unit 111. The pixel unit 101a includes, for example, a photodiode (photoelectric conversion element) 201a, a transfer transistor 202a, an amplification transistor (source follower transistor) 203a, a reset transistor 204a and a selection transistor 205a. The pixel unit 101b includes, for example, a photodiode 201b, a transfer transistor 202b, an amplification transistor (source follower transistor) 203b, a reset transistor 204b and a selection transistor 205b. The pixel unit 101a also includes a floating diffusion (hereinafter, also called "FD") connecting transistor 206a, and the pixel unit 101b also includes an FD connecting transistor 206b.

The photodiode 201a generates an electric charge by photoelectric conversion. The transfer transistor 202a transfers the electric charge generated by photoelectric conversion in the photodiode 201a to the FD 207a. The electric charge determines the voltage of the FD 207a. The FD 207a is a node common to a gate of the amplification transistor 203a. The amplification transistor 203a amplifies a signal based on the electric charge transferred to the FD 207a and outputs the signal to a column signal line 110 through the selection transistor 205a. The column signal line 110 is connected to the constant current source 102 to form a source follower circuit. The pixel unit 101b is also configured in the same way as the pixel unit 101a and is connected to the column signal line 110.

The FD 207a is connected to the reset transistor 204a, and the FD 208b is connected to the reset transistor 204b. The FD connecting transistor 206a configured to electrically connect or disconnect the FD 207a and the FD 207b is arranged between the FD 207a and the FD 207b. If the FD connecting transistor 206a is turned off, signals of the photodiodes 201a and 201b can be individually output. If the FD connecting transistor 206a is turned on, signal charges of the adjacent photodiodes 201a and 201b can be output by combining the electric charges on the FD. The reset transistors 204a and 204b and the amplification transistors 203a and 203b are connected to a power supply SVDD of pixels.

In the pixel unit 101a, a drive line PTX_a is connected to a gate electrode of the transfer transistor 202a. A drive line PRES_a is connected to a gate electrode of the reset transistor 204a. A drive line PSEL_a is connected to a gate electrode of the selection transistor 205a. A drive line PADD_a is connected to a gate electrode of the FD connecting transistor 206a. The pixel unit 101b also has a similar configuration.

The signal amplifying unit 104 includes, for example, a clamping capacitor 230, an inverting amplifier 208, a feedback capacitor 209 and a clamp switch 210. The column signal line 110 is connected to one end of the clamping capacitor 230 of the signal amplifying unit 104. The feedback capacitor 209 and the clamp switch 210 are connected in parallel between an input end and an output end of the inverting amplifier 208.

An output end of the signal amplifying unit 104 is connected to the signal holding unit 105. The signal holding unit 105 includes, for example, switches 211 and 212 and holding capacitors 213 and 214. The holding capacitors 213 and 214 can have the same capacitor value. An output end of the signal amplifying unit 104 is connected to the holding capacitors 213 and 214 through the switches 211 and 212, respectively. The control unit 106 controls the clamp switch 210 and the switches 211 and 212.

Signals held by the holding capacitors 213 and 214 are output to the horizontal output line (noise component) 217 and the horizontal output line (light signal component) 218 when the column selection switches 215 and 216 are turned on according to a PH pulse provided from the horizontal scanning circuit 108. The holding capacitors 213 and 214 hold N (noise) output and S (light signal) output, respectively, and the output amplifier 109 amplifies and outputs a difference between the N output and the S output.

The resetting unit 111 includes, for example, switches 219 and 220. The horizontal output line (noise component) 217 is connected to a voltage VCHR through the switch 219, and the horizontal output line (light signal component) 218 is connected to a voltage VCHR through the switch 220. The switches 219 and 220 are turned on at timing of a drive pulse PCHR to reset the horizontal output line (noise component) 217 and the horizontal output line (light signal component) 218.

Figure 3:
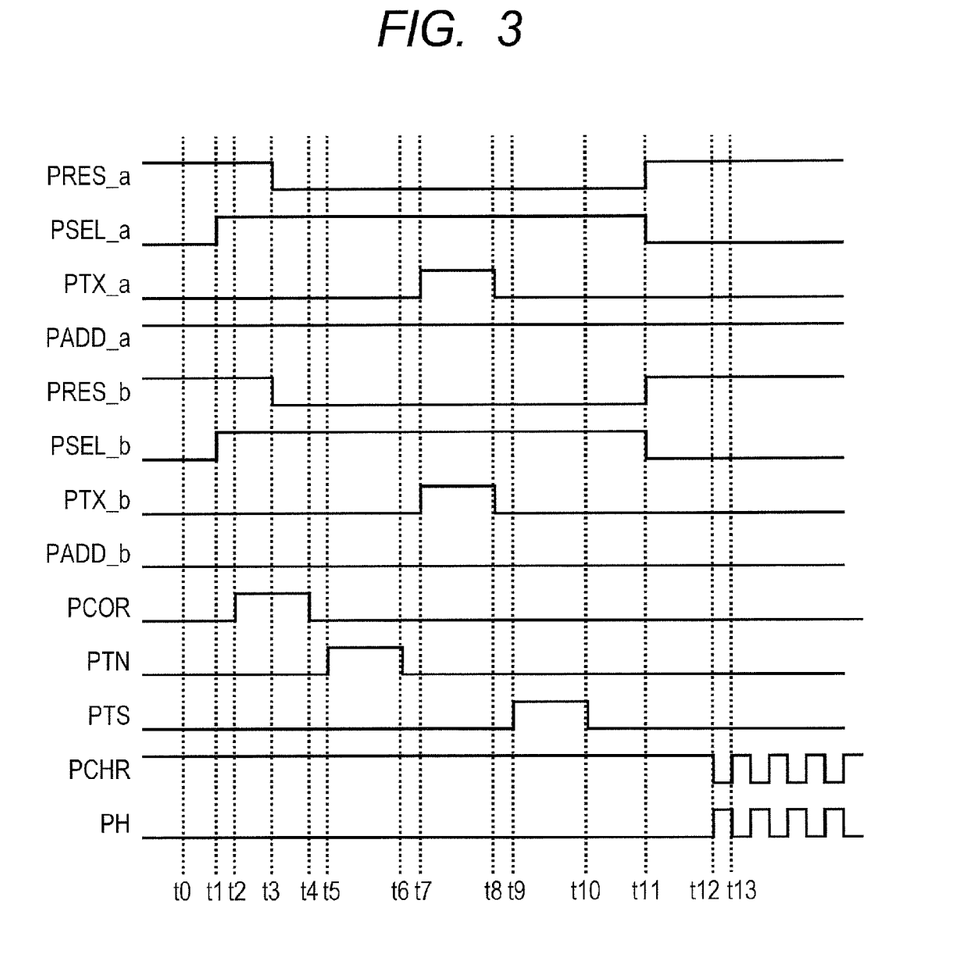
FIG. 3 is a timing diagram illustrating an operation example of the solid-state imaging apparatus according to a first embodiment.

FIG. 3 is a timing diagram illustrating an operation example of the solid-state imaging apparatus illustrated in FIGS. 1 and 2. Operation of the solid-state imaging apparatus will be described with reference to FIG. 3.

In an initial state at time t0, reset signals PRES_a and PRES_b are in a high level (ON state), and the FD 207a and the FD 207b are reset by a reset voltage SVDD through the reset transistors 204a and 204b. A signal PADD_a is also in the high level, and the FD 207a and the FD 207b are connected electrically through the FD connecting transistor 206a. A signal PCHR is also in the high level, and the horizontal output lines 217 and 218 are reset to the voltage VCHR.

At time t1, selection signals PSEL_a and PSEL_b input to gates of the selection transistors 205a and 205b are switched to the high level. As a result, the selection transistors 205a and 205b are turned on, and the amplification transistors 203a and 203b are activated. Since the reset transistors 204a and 204b are on in this state, the FD 207a and the FD 207b are reset by the reset voltage SVDD. At time t2, a clamp pulse PC04 is switched to the high level, and the clamp switch 210 is turned on. The inverting amplifier 208 enters a unity gain buffer state, and a voltage of VC0R is output.

At time t3, the reset signals PRES_a and PRES_b input to gates of the reset transistors 204a and 204b are switched to a low level. The reset transistors 204a and 204b are turned off, and the voltages of the FD 207a and the FD 207b are fixed to a black signal level. Since the FD connecting transistor 206a is on, the voltages of the FD 207a and the FD 207b become the same, and a reference voltage VN of the column signal line 110 is determined. At time t4, the clamp pulse PC0R is switched to the low level. The clamp switch 210 is turned off, and the reference voltage VN of the column signal line 110 is clamped.

At time t5, a PTN pulse is switched to the high level, and the switch 211 of the signal holding unit 105 is turned on. Writing of a value of a sum of the voltage of VC0R and an offset voltage of the inverting amplifier 208 in the holding capacitor 213 is started. At time t6, the PTN pulse is switched to the low level, and the writing is finished.

At time t7, transfer pulses PTX_a and PTX_b input to gates of the transfer transistors 202a and 202b are switched to the high level. As a result, the transfer transistors 202a and 202b are turned on, and signal charges of the photodiodes 201a and 201b are transferred to the FD 207a and the FD 207b. At time t8, the transfer pulses PTX_a and PTX_b are switched to the low level, and the transfer of the signal charges is completed. Since the FD connecting transistor 206a is on, the signal charges of the photodiodes 201a and 201b are added on the FD 207a and the FD 207b, and the voltages become the same. At time t9, a PTS pulse is switched to the high level. The switch 212 of the signal holding unit 105 is turned on, and the signal is written in the holding capacitor 214.

As a result of the switch of the transfer pulses PTX_a and PTX_b to the high level, the voltage of the column signal line 110 changes from VN to VS. If the signal charge is based on electron, there is a relationship of VS<VN. A voltage derived by inverting an amount of change (VS−VS) of the voltage by a ratio (C0/Cf) of a capacitor value C0 of the clamping capacitor 230 and a capacitor value of the feedback capacitor 209, the voltage of VC0R and the offset voltage of the inverting amplifier 208 are added. The added voltage is written in the holding capacitor 214 through the switch 212 of the signal holding unit 105. At time t10, the PTS pulse is switched to the low level. The switch 212 is turned off, and the writing is finished.

At time t11, the reset signals PRES_a and PRES_b are switched to the high level. The reset transistors 204a and 204b are turned on, and the FD 207a and the FD 207b are reset. At the same time, the selection signals PSEL_a and PSEL_b are switched to the low level, and the selection transistors 205a and 205b are turned off. As a result, the selection of the row is canceled. At time t12, the PH pulse provided from the horizontal scanning circuit 108 turns on the column selection switches 215 and 216. The output amplifier 109 calculates the difference between the N output and the S output and outputs an image signal. This is finished at time t13. Subsequently, the reset of the horizontal output lines 217 and 218 based on PCHR and the column selection based on the PH pulse are alternately performed, and signals of the columns are sequentially output.

Bias conditions of the transistors in a period from the time t1 to the time t2 will be described. Assuming that the voltage SVDD is 5.0 V, the gate high voltage of the reset transistors 204a and 204b is 5.0 V, and the threshold (Vth) of the reset transistor is 0.3 V, the voltage of the FDs 207a and 207b is 4.7 V. At that time, it is assumed that the gate high voltage of the FD connecting transistor 206a is 5.0 V and that the threshold of the FD connecting transistor 206a is 0.4 V. In this case, a formula (gate high voltage of FD connecting transistor)−(reset voltage of FD)>(threshold of FD connecting transistor) cannot be satisfied, and resistance at the FD connecting transistor 206a becomes high. At the time t7, the transfer pulses PTX_a and PTX_b input to the gates of the transfer transistors 202a and 202b are switched to the high level. The signal charges of the photodiodes 201a and 201b are transferred to the FDs 207a and 207b, and the voltage of the FDs is reduced. It is assumed that the voltage of the FDs 207a and 207b has become 4.0 V. In this state, the formula (gate high voltage of FD connecting transistor)−(reset voltage of FD)>(threshold of FD connecting transistor) can be satisfied, and the FD connecting transistor 206a turns on. When the FD connecting transistor 206a turns on, the channel capacitor can be seen. Therefore, the capacitor during the output of the reference voltage VN and the capacitor during the output of the signal voltage VS are different in the FDs 207a and 207b, and the output linearity may be reduced. In the present embodiment, the threshold of the FD connecting transistor 206 is set lower than the thresholds of other transistors such as the reset transistor 204. For example, the threshold of the FD connecting transistor 206 is set to 0.1 V to easily turn on the FD connecting transistor 206a even if there are power supply fluctuations or production variations of threshold. As a result, the reference voltage VN and the added signal voltage VS of signal charges can be read while the capacitors in the FDs 207a and 207b are kept constant, and a correct image signal can be obtained based on (S−N).

In the operation example, two selection transistors 205a and 205b are turned on, and the signals are output by the amplification transistors 203a and 203b. However, the arrangement is not limited to this. For example, the selection signal PSEL_b may be fixed to the low level to turn off the selection transistor 205b, and only the amplification transistor 203a may output the signal. However, the use of two amplification transistors 203a and 203b doubles the effective area of the amplification transistors, and 1/f noise caused by the amplification transistors can be reduced. Furthermore, the use of two amplification transistors 203a and 203b effectively doubles the channel width of the amplification transistors, and an overdrive voltage can be reduced. Therefore, a dynamic range of the column signal line 110 can be expanded.

Second Embodiment

A second embodiment will be described.

Figure 4:
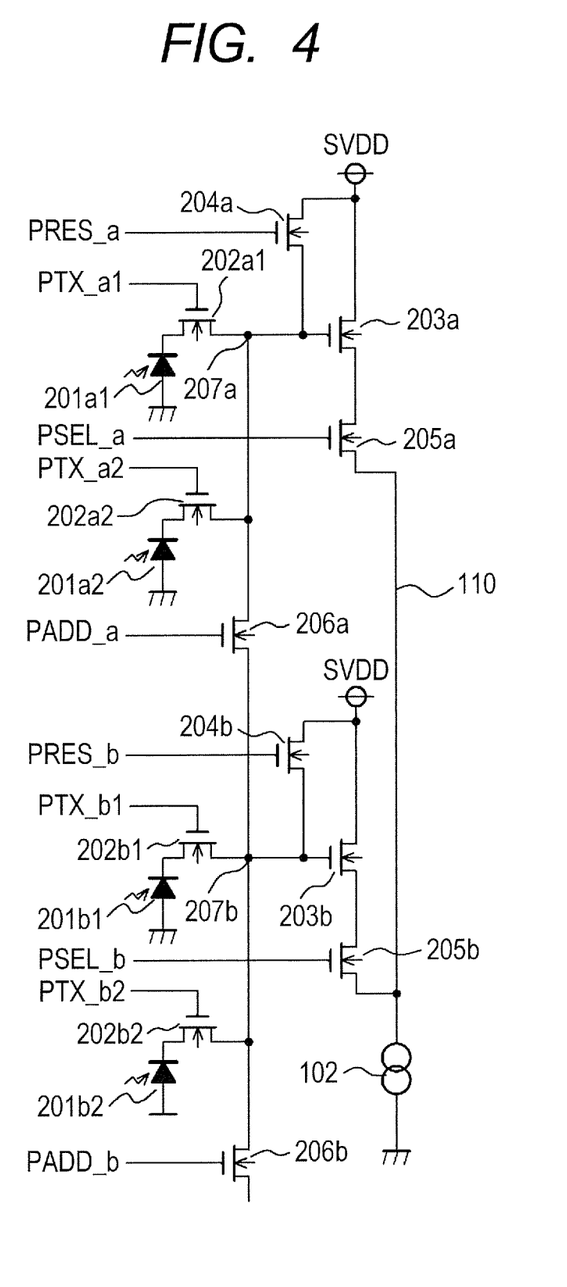
FIG. 4 is a pixel circuit diagram of a solid-state imaging apparatus according to a second embodiment.

FIG. 4 is a pixel circuit diagram of a solid-state imaging apparatus according to a second embodiment. In pixels of the solid-state imaging apparatus illustrated in FIG. 4, a photodiode 201a1 is connected to the FD 207a through a transfer transistor 202a1, and a photodiode 201a2 is connected to the FD 207a through a transfer transistor 202a2. A photodiode 201b1 is connected to the FD 207a through a transfer transistor 202b1, and a photodiode 201b2 is connected to the FD 207a through a transfer transistor 202b2. Therefore, FIG. 4 illustrates a structure including two pairs of pixels with a common FD for two photodiodes, and the FD 207a and the FD 207b are connected by the FD connecting transistor 206a.

The transfer transistor 202a1 transfers an electric charge generated by photoelectric conversion in the first photodiode 201a1 to the FD 207a. The transfer transistor 202a2 transfers an electric charge generated by photoelectric conversion in the second photodiode 201a2 to the FD 207a. Similarly, the transfer transistor 202b1 transfers an electric charge generated by photoelectric conversion in the third photodiode 201b1 to the FD 207b. The transfer transistor 202b2 transfers an electric charge generated by photoelectric conversion in the fourth photodiode 201b2 to the FD 207b.

In a case of a color filter of a Bayer color array, the first photodiode PD 201a1 and the third photodiode PD 201b1 are the same color, and the second photodiode PD 201a2 and the fourth photodiode 201b2 are the same color. Therefore, same colors can be added.

Although the number of transfer pulses PTX increases from the ones illustrated in FIG. 3, the reading timing is basically the same. The bias conditions of the transistors are also basically the same as those of the first embodiment. The threshold of the FD connecting transistor 206a can be set lower than the threshold of the reset transistor 204a to easily turn on the FD connecting transistor 206a even if there are power supply fluctuations or production variations of threshold. As a result, the reference voltage VN and the added signal voltage VS of signal charges can be read while the capacitors in the FDs 207a and 207b are kept constant, and a correct image signal can be obtained.

Figure 5:
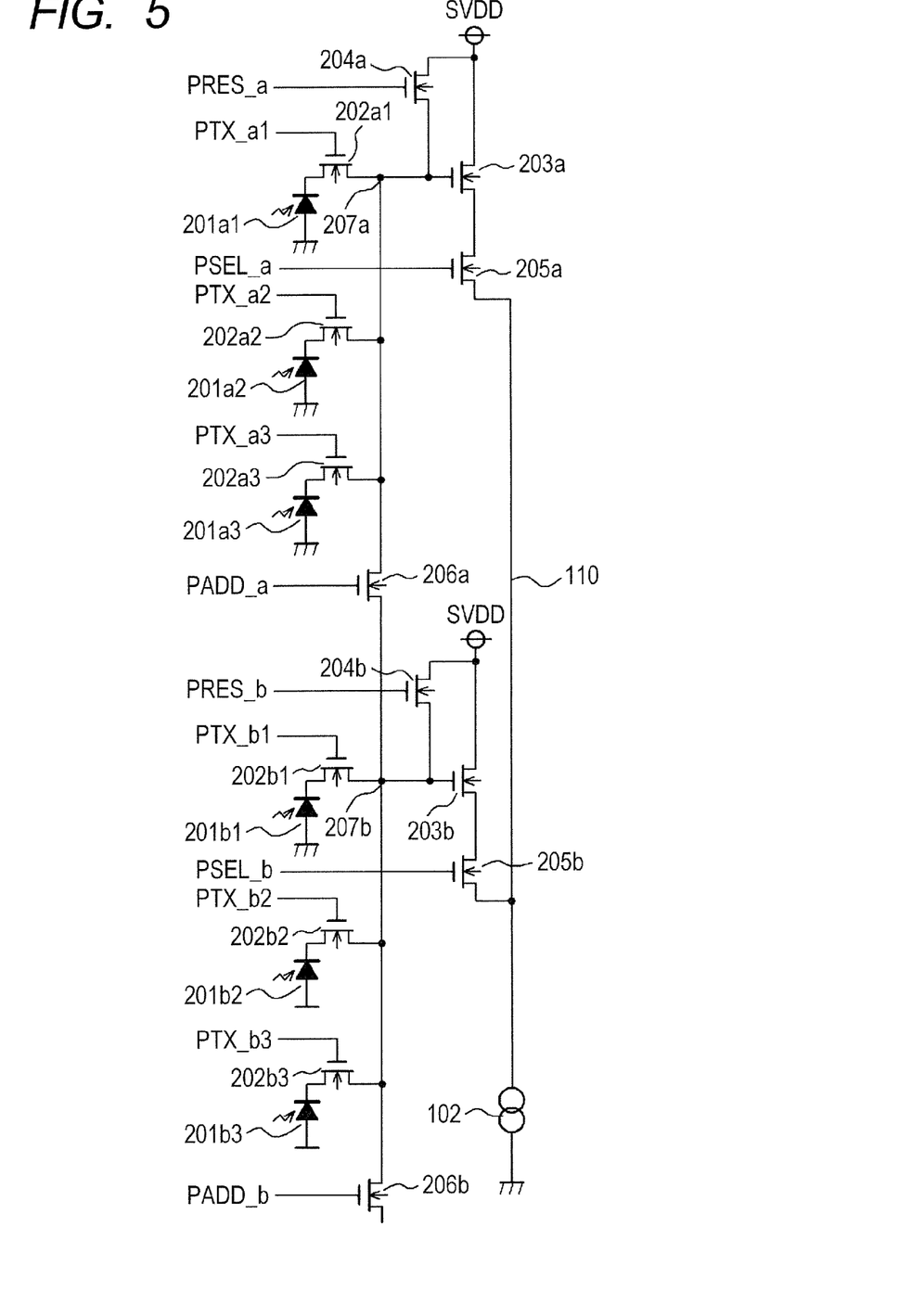
FIG. 5 is a pixel circuit diagram of the solid-state imaging apparatus according to the second embodiment.

Although the pixel structure with one common FD for two photodiodes has been illustrated in the present embodiment, the arrangement is not limited to this. A similar effect can be attained by a pixel structure with one common FD for a plurality of photodiodes, such as a pixel structure with one common FD for three photodiodes as illustrated for example in FIG. 5.

Third Embodiment

A third embodiment will be described.

Figure 6:
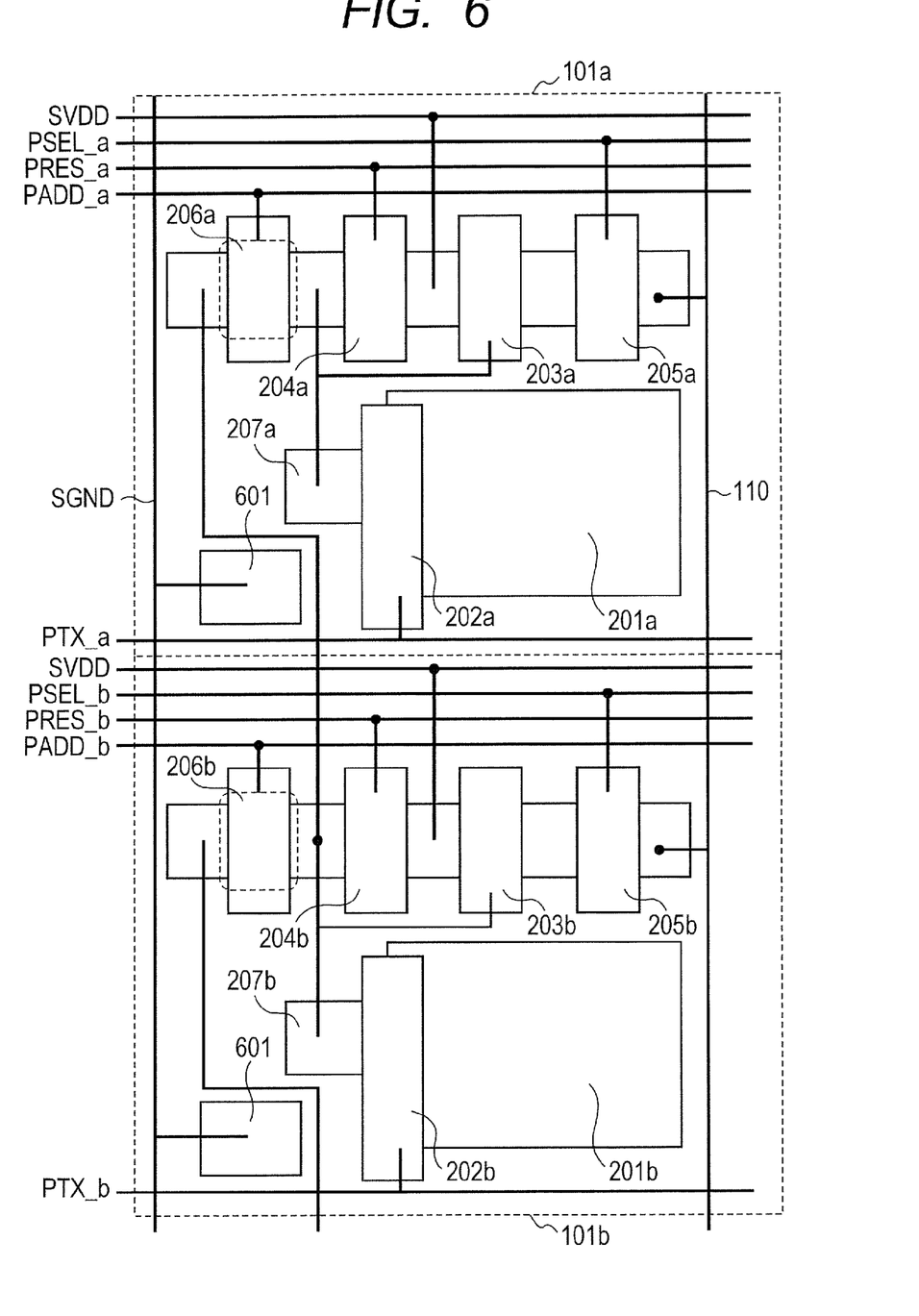
FIG. 6 is a pixel layout diagram of a solid-state imaging apparatus according to a third embodiment.

FIG. 6 is a diagram illustrating a pixel layout of a solid-state imaging apparatus according to a third embodiment. Reference numerals in FIG. 6 correspond to those of the circuit diagram illustrated in FIG. 2. The pixel unit 101a includes the photodiode 201a, the transfer transistor 202a, the amplification transistor 203a, the reset transistor 204a, the selection transistor 205a, the FD connecting transistors 206a and 207a and a well contact 601. The well contact 601 is configured to fix a well of the pixel unit to a reference voltage (0 V) and is connected to a reference voltage SGND of the pixel. In the pixel unit 101a, the drive line PTX_a is connected to the gate electrode of the transfer transistor 202a. The drive line PRES_a is connected to the gate electrode of the reset transistor 204a. The drive line PSEL_a is connected to the gate electrode of the selection transistor 205a. The drive line PADD_a is connected to the gate electrode of the FD connecting transistor 206a. The pixel unit 101b also has a similar configuration.

In the third embodiment, ions for reducing the threshold of the FD connecting transistors 206a and 206b are implanted within a dotted frame of FIG. 6. More specifically, the FD connecting transistors 206a and 206b have a channel region doped with an impurity of a quantity different from a quantity of an impurity doped into a channel region of another transistor such as the reset transistor 204a. This can reduce the threshold of the FD connecting transistors 206a and 206b, compared to other transistors. Ions with N-type impurities are implanted when the FD connecting transistors 206a and 206b are NMOS transistors, and ions with P-type impurities are implanted when the FD connecting transistors 206a and 206b are PMOS transistors.

According to the third embodiment, the FD connecting transistors 206a and 206b can be surely turned on without being affected by power supply fluctuations or production variations of threshold. Therefore, the reference voltage VN and the added signal voltage VS of signal charges can be read while the capacitors in the FDs 207a and 207b are kept constant, and a correct image signal can be obtained.

Fourth Embodiment

A fourth embodiment will be described.

Figure 7:
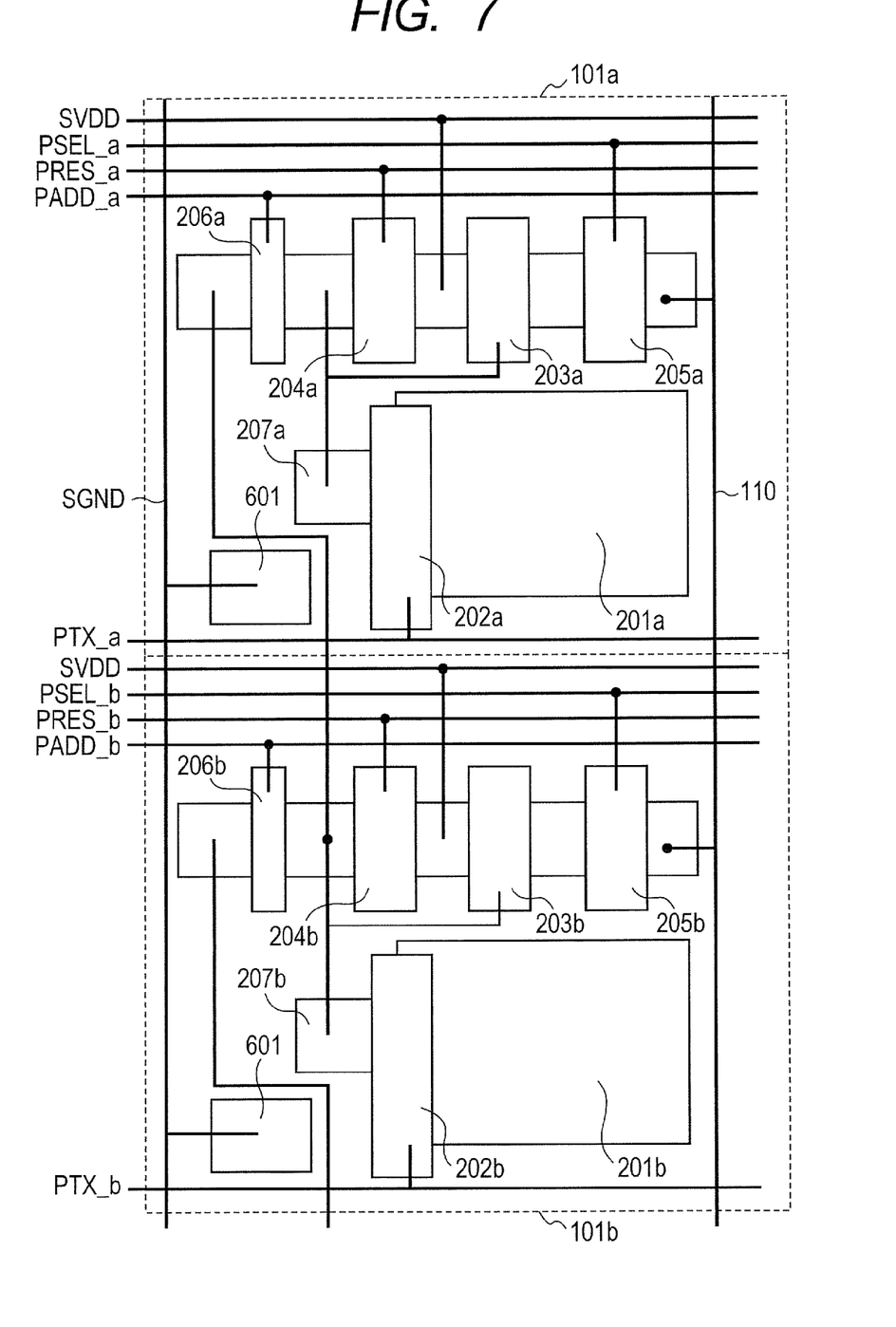
FIG. 7 is a pixel layout diagram of a solid-state imaging apparatus according to a fourth embodiment.

FIG. 7 is a diagram illustrating an image layout of a solid-state imaging apparatus according to the fourth embodiment. Reference numerals in FIG. 7 are the same as those illustrated in FIG. 6. In the fourth embodiment, a channel length L of the FD connecting transistors 206a and 206b is shorter than channel lengths of other transistors, such as the reset transistors 204a and 204b, to reduce the threshold of the FD connecting transistors 206a and 206b. As a result, the threshold of the FD connecting transistors 206a and 206b can be reduced by the short channel effect, and the FD connecting transistors 206a and 206b can be surely turned on without being affected by power supply fluctuations or production variations of threshold. Therefore, the reference voltage VN and the added signal voltage VS of signal charges can be read while the capacitors in the FDs 207a and 207b are kept constant, and a correct image signal can be obtained. Since the FD connecting transistors 206a and 206b are operated as on-fixed or off-fixed switches, there is no side effect of the short channel effect in the output as long as punch-through does not occur. Compared to the third embodiment, the fourth embodiment has an advantage that the number of ion implantation processes can be reduced.

Fifth Embodiment

A fifth embodiment will be described.

Figure 8:
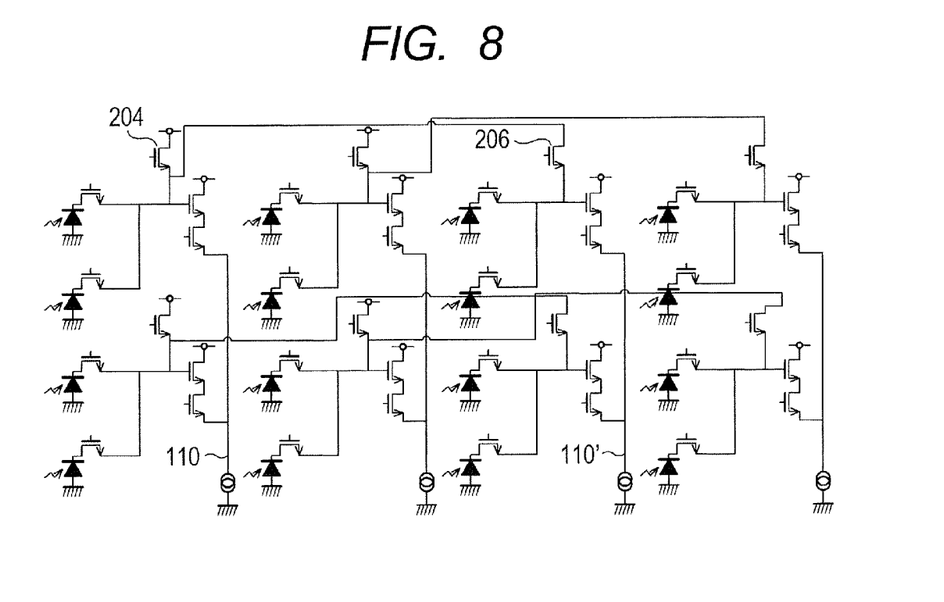
FIG. 8 is a pixel circuit diagram of a solid-state imaging apparatus according to a fifth embodiment.
Figure 9:
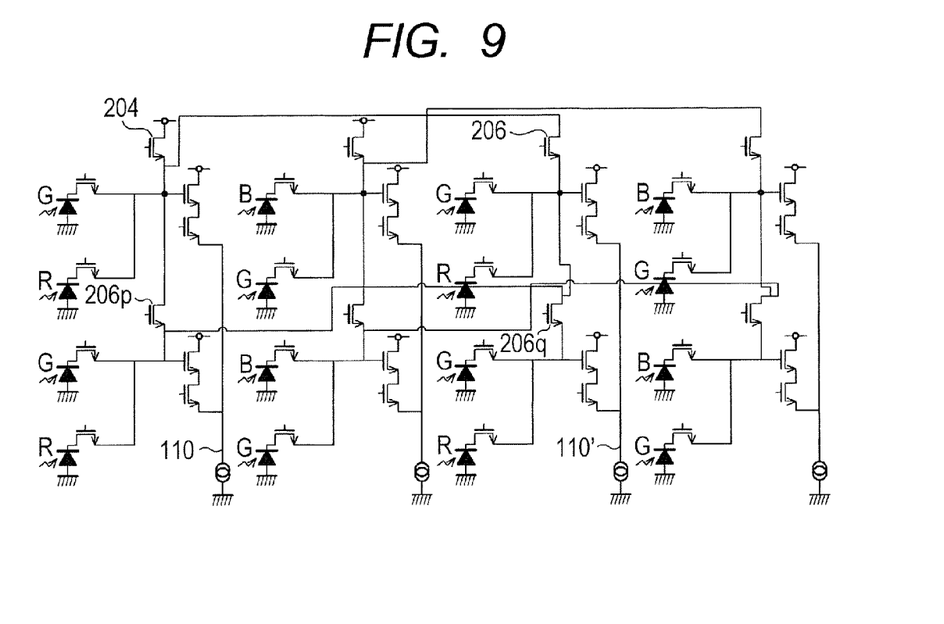
FIG. 9 is a pixel circuit diagram of the solid-state imaging apparatus according to the fifth embodiment.

FIGS. 8 and 9 are pixel circuit diagrams of a solid-state imaging apparatus according to a fifth embodiment. The embodiments described above have illustrated examples of arranging the FD connecting transistor 206 for electrical connection or disconnection between the floating diffusions in the vertical direction (column direction). The arrangement is not limited to this, and floating diffusions in the horizontal direction (row direction), or floating diffusions in the vertical direction (column direction) and the horizontal direction (row direction) may be electrically connected or disconnected.

FIG. 8 illustrates an example of arranging the FD connecting transistor 206 for electrical connection or disconnection between floating diffusions in the horizontal direction (row direction), i.e. FDs of pixels arranged in the same row. The example illustrated in FIG. 8 has an effect that the same color combination in the horizontal direction is possible. FIG. 9 illustrates an example of arranging the FD connecting transistor 206 for electrical connection or disconnection between floating diffusions in the vertical direction (column direction) and the horizontal direction (row direction), i.e. FDs of pixels arranged in the same column and FDs of pixels arranged in the same row. The example illustrated in FIG. 9 has an effect that the same color combination in the vertical direction and the horizontal direction is possible. The same driving method as the method described in the first embodiment can be basically used.

In the examples illustrated in FIGS. 8 and 9, the threshold of the FD connecting transistor 206 can be set lower than the threshold of the reset transistor 204 to surely turn on the FD connecting transistor 206 without being affected by power supply fluctuations or production variations of threshold. As a result, the reference voltage VN and the added signal voltage VS of signal charges can be read while the capacitors in the FDs are kept constant, and a correct image signal can be obtained.

(Application to Imaging System)

Figure 10:
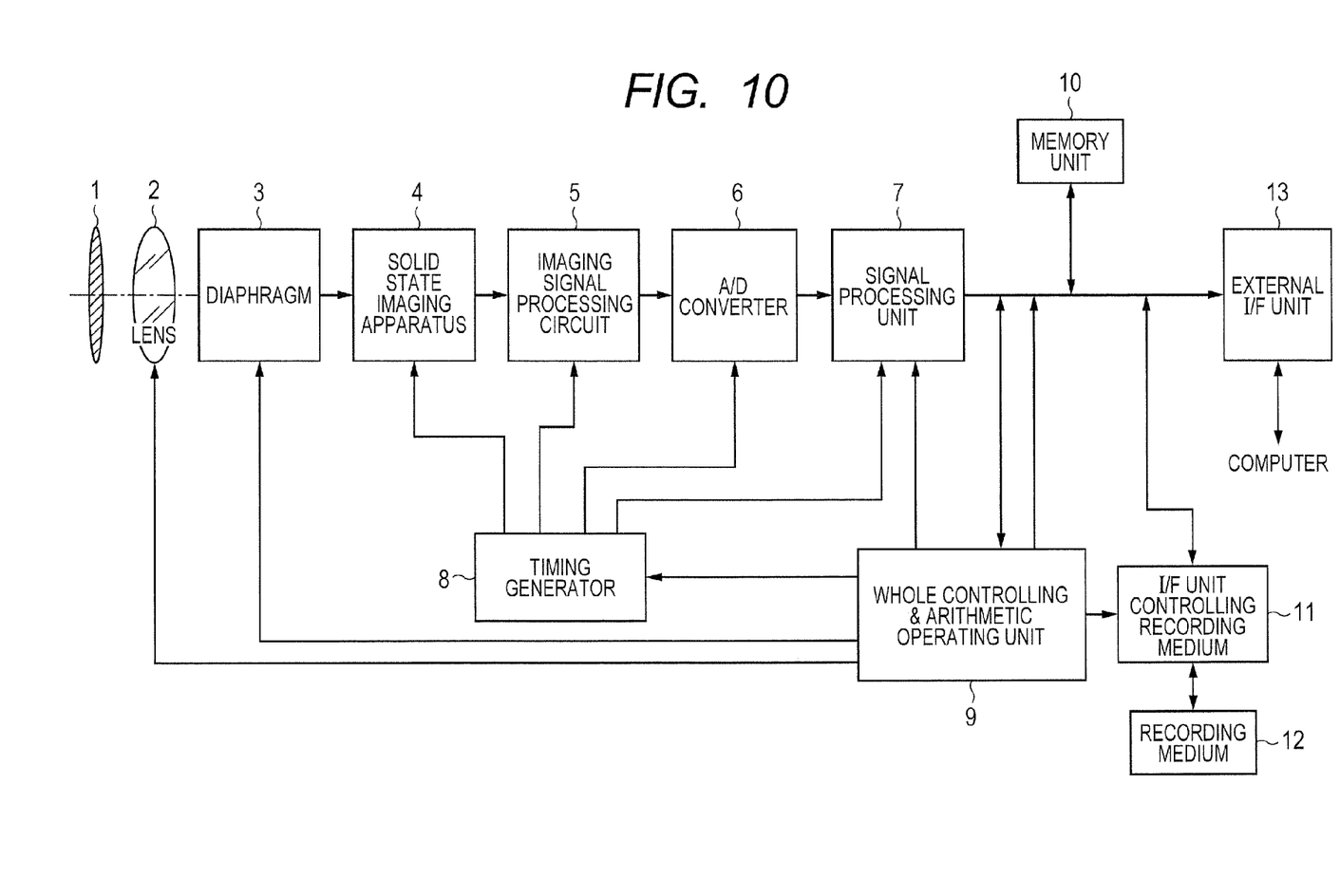
FIG. 10 is a diagram illustrating a configuration example of an imaging system according to a sixth embodiment.

FIG. 10 is a diagram illustrating a configuration example of an imaging system (still video camera) according to a sixth embodiment. The imaging system is a system using the solid-state imaging apparatus of arbitrary one of the embodiments. A configuration of the imaging system will be described. A barrier 1 serves both as a protection of a lens 2 and a main switch. The lens 2 forms an optical image of a subject on a solid-state imaging apparatus 4. A diaphragm 3 changes the amount of light passing through the lens 2. The solid-state imaging apparatus 4 is equivalent to the solid-state imaging apparatus of the embodiments and is configured to import an image signal of the subject imaged by the lens 2. An imaging signal processing circuit applies processes, such as various corrections and clamping, to an image signal output from the solid-state imaging apparatus 4. An A/D converter 6 performs analog-digital conversion of an image signal output by the imaging signal processing circuit 5. A signal processing unit 7 applies various corrections to image data output by the A/D converter 6 or compresses data. A timing generator 8 outputs various timing signals to the solid-state imaging apparatus 4, the imaging signal processing circuit 5, the A/D converter 6 and the signal processing unit 7. The circuits 5 to 8 may be formed on the same chip as that of the solid-state imaging apparatus 4. A whole controlling and arithmetic operating unit 9 controls various arithmetic operations and the whole imaging system. A memory unit 10 temporarily stores image data. An interface unit 11 for controlling recording medium performs recording and reading to and from a recording medium 12. The recording medium 12 is a removable medium, such as a semiconductor memory, for recording or reading image data. An external interface (I/F) unit 13 communicates with an external computer.

Operation of FIG. 10 will be described. When the barrier 1 is opened, a main power supply is turned on. A power supply of a control system is then turned on, and a power supply of imaging system circuits, such as the A/D converter 6, is turned on. The whole controlling and arithmetic operating unit 9 opens the diaphragm 3 to control the amount of exposure, and a signal output from the solid-state imaging apparatus 4 is output to the A/D converter 6 through the imaging signal processing circuit 5. The A/D converter 6 performs A/D conversion of the signal and outputs the signal to the signal processing unit 7. The signal processing unit 7 performs, by the whole controlling and arithmetic operating unit 9, arithmetic operation of exposure based on the data.

The brightness is determined by the result of the photometry, and the whole controlling and arithmetic operating unit 9 controls the diaphragm 3 according to the result. High frequency components are extracted based on the signal output from the solid-state imaging apparatus 4, and the whole controlling and arithmetic operating unit 9 performs arithmetic operation of the distance to the subject. The lens 2 is then driven to determine whether the subject is focused, and if it is determined that the subject is not focused, the lens 2 is driven again to perform ranging.

The main exposure is started after the focusing is confirmed. When the exposure is finished, the imaging signal processing circuit 5 corrects the image signal output from the solid-state imaging apparatus 4, and the A/D converter 6 performs A/D conversion of the image signal. The image signal passes through the signal processing unit 7, and the whole controlling and arithmetic operating unit 9 stores the image signal in the memory unit 10. The data stored in the memory unit 10 passes through the I/F unit 11 for controlling recording medium based on control by the whole controlling and arithmetic operating unit 9, and the data is recorded in the removable recording medium 12 such as a semiconductor device. The data may be directly input to a computer through the external I/F unit 13 to process the image.

As described, the embodiments of the present invention include one of the following features. In a first configuration, the threshold of the connecting transistor is lower than the threshold of the reset transistor. This is described in the first embodiment, for example.

In a second configuration, the quantity of the impurity doped into the channel region of the connecting transistor and the quantity of the impurity doped into the channel region of the reset transistor are different. This is described in the second embodiment, for example.

In a third configuration, the channel length of the connecting transistor is shorter than the channel length of the reset transistor. This is described in the fourth embodiment, for example.

In a fourth configuration, the voltage derived by subtracting the reset voltage of the floating diffusion from the high level voltage of the gate of the connecting transistor is higher than the threshold voltage of the connecting transistor. This is described in the first embodiment, for example.

One of the configurations may be included, or a combination of a plurality of configurations or all of the configurations may be included.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2012-064144, filed on Mar. 21, 2012, and No. 2012-063764 which are hereby incorporated by reference herein in their entirety.

What is claimed is:

1. A solid-state imaging apparatus comprising a plurality of pixels arranged two-dimensionally,
wherein each of the pixels comprises:
a photoelectric conversion element configured to generate electric charges by photoelectric conversion;
a floating diffusion;
a transfer transistor configured to transfer the electric charges generated by the photoelectric conversion element to the floating diffusion;
an amplifying portion configured to output a signal based on the electric charges in the floating diffusion; and
a reset transistor configured to reset a voltage of the floating diffusion, and wherein
the solid-state imaging apparatus further comprises
a connecting transistor configured to connect electrically the floating diffusions of at least two of the plurality of pixels to each other to add the electric charges in the floating diffusions of the at least two of the plurality of pixels, and
a threshold voltage of the connecting transistor is significantly lower than a threshold voltage of the reset transistor so that a voltage derived by subtracting a reset voltage of the floating diffusion from a high level voltage of a gate of the connecting transistor is higher than the threshold voltage of the connecting transistor.

2. The solid-state imaging apparatus according to claim 1, wherein the amplifying portion is shared by a plurality of photoelectric conversion elements.

3. A solid-state imaging apparatus comprising a plurality of pixels arranged two-dimensionally,
wherein each of the pixels comprises:
a photoelectric conversion element configured to generate electric charges by photoelectric conversion;
a floating diffusion;
a transfer transistor configured to transfer the electric charges generated by the photoelectric conversion element to the floating diffusion;
an amplifying portion configured to output a signal based on the electric charges in the floating diffusion; and
a reset transistor configured to reset a voltage of the floating diffusion, and wherein the solid-state imaging apparatus further comprises
a connecting transistor configured to connect electrically the floating diffusions of at least two of the plurality of pixels to each other to add the electric charges in the floating diffusions of the at least two of the plurality of pixels, the connecting transistor has a channel length shorter than that of the reset transistor and a threshold voltage of the connecting transistor is significantly lower than a threshold voltage of the reset transistor so that a voltage derived by subtracting a reset voltage of the floating diffusion from a voltage of a gate of the connecting transistor is higher than the threshold voltage of the connecting transistor.

4. The solid-state imaging apparatus according to claim 3, wherein the amplifying portion is shared by a plurality of photoelectric conversion elements.

5. The solid-state imaging apparatus according to claim 1, wherein a high level voltage of a gate of the reset transistor is lower than the high level voltage of the gate of the connecting transistor.

6. The solid-state imaging apparatus according to claim 1, wherein a drain voltage of the reset transistor is lower than the high level voltage of the gate of the connecting transistor.

7. The solid-state imaging apparatus according to claim 1, wherein the threshold voltage of the connecting transistor is set to 0.1V.

8. The solid-state imaging apparatus according to claim 1, wherein the threshold voltage of the reset transistor is set to 0.3 V.

* * * * *